US008339210B2

(12) United States Patent
Nylen

(10) Patent No.: US 8,339,210 B2
(45) Date of Patent: Dec. 25, 2012

(54) LOW NOISE OSCILLATOR

(75) Inventor: Tomas Nylen, Upplands Vasby (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 13/130,670

(22) PCT Filed: May 11, 2011

(86) PCT No.: PCT/SE2011/050601
§ 371 (c)(1),
(2), (4) Date: May 23, 2011

(87) PCT Pub. No.: WO2012/154098
PCT Pub. Date: Nov. 15, 2012

(65) Prior Publication Data
US 2012/0286879 A1 Nov. 15, 2012

(51) Int. Cl.
*H03B 5/12* (2006.01)
(52) U.S. Cl. ...................... 331/117 R; 331/34
(58) Field of Classification Search .............. 331/34, 331/117 FE, 117 R, 167
See application file for complete search history.

(56) References Cited

U.S. PATENT DOCUMENTS

| | | | | |
|---|---|---|---|---|
| 5,912,596 | A * | 6/1999 | Ghoshal | 331/117 R |
| 7,202,754 | B2 * | 4/2007 | Komurasaki et al. | 331/181 |
| 7,551,038 | B2 * | 6/2009 | Jang et al. | 331/45 |
| 8,018,292 | B2 * | 9/2011 | Wachi et al. | 331/117 R |
| 8,134,421 | B2 * | 3/2012 | Hirashiki et al. | 332/146 |
| 2004/0178857 | A1 | 9/2004 | Jacobsson et al. | |
| 2008/0284534 | A1 | 11/2008 | El Rai | |
| 2010/0248647 | A1 | 9/2010 | Wachi | |
| 2011/0148536 | A1 | 6/2011 | Italia et al. | |

OTHER PUBLICATIONS

International Search Report and Written Opinion of the International Searching Authority Corresponding to International Application No. PCT/SE2011/050601; Date of Mailing: Feb. 23, 2012.

* cited by examiner

*Primary Examiner* — Levi Gannon
(74) *Attorney, Agent, or Firm* — Myers Bigel Sibley & Sajovec, P.A.

(57) ABSTRACT

An oscillator for use in generating a signal having a desired frequency includes a first inductor element being electrically coupled from one end of a first capacitive element to a first voltage connection point, a second inductor element being electrically coupled from one end of a second capacitive element to a second voltage connection point, a third inductor element being electrically coupled from another end of the first capacitive element to the first voltage connection point, a fourth inductor element being electrically coupled from another end of the second capacitive element to the second voltage connection point. The first, second, third, and fourth inductor elements being configured such that a first conductive trace loop formed by the first and third inductor elements is interleaved with a second conductive trace loop formed by the second and fourth inductor elements such that said conductive trace loops are configured to operate in substantially a same magnetic field. A first drive circuit is electrically coupled to the first and second inductor elements forming a first resonance circuit with the first and second capacitive elements and a second drive circuit is electrically coupled to the third and fourth inductor elements forming a second resonance circuit with the first and second capacitive elements, such that the first and second drive circuits are mutually configured to establish and maintain a unified oscillation in the first and second resonance circuits at the desired frequency.

18 Claims, 7 Drawing Sheets

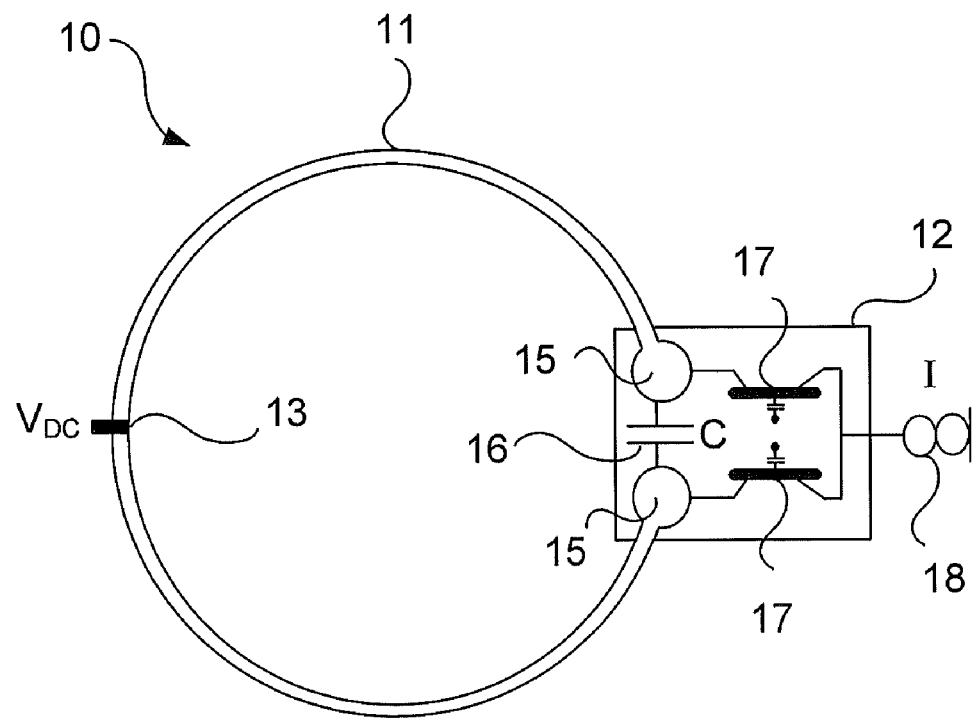
Fig. 1 - PRIOR ART
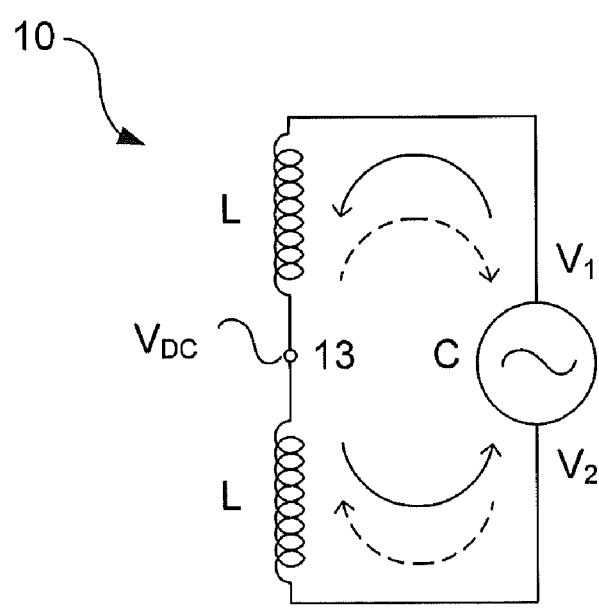
Fig. 2 - PRIOR ART

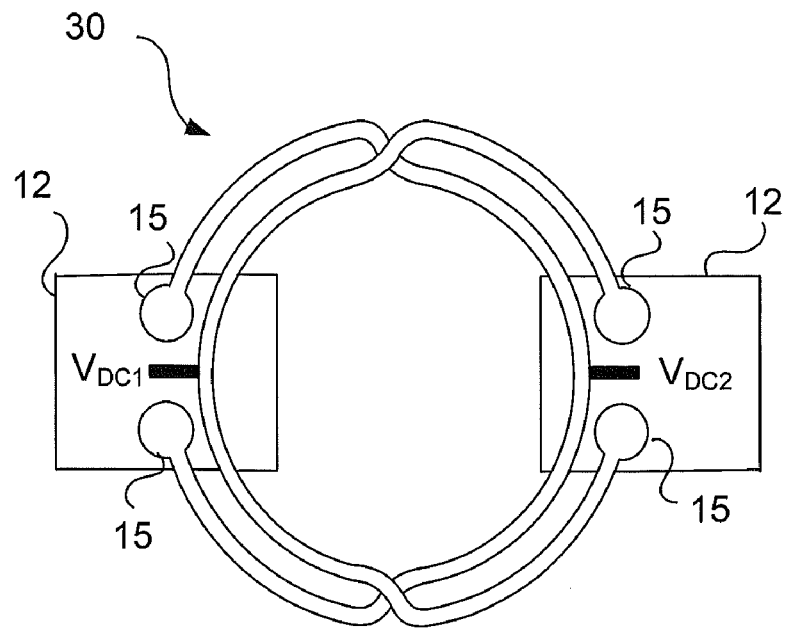
Fig. 3 - PRIOR ART
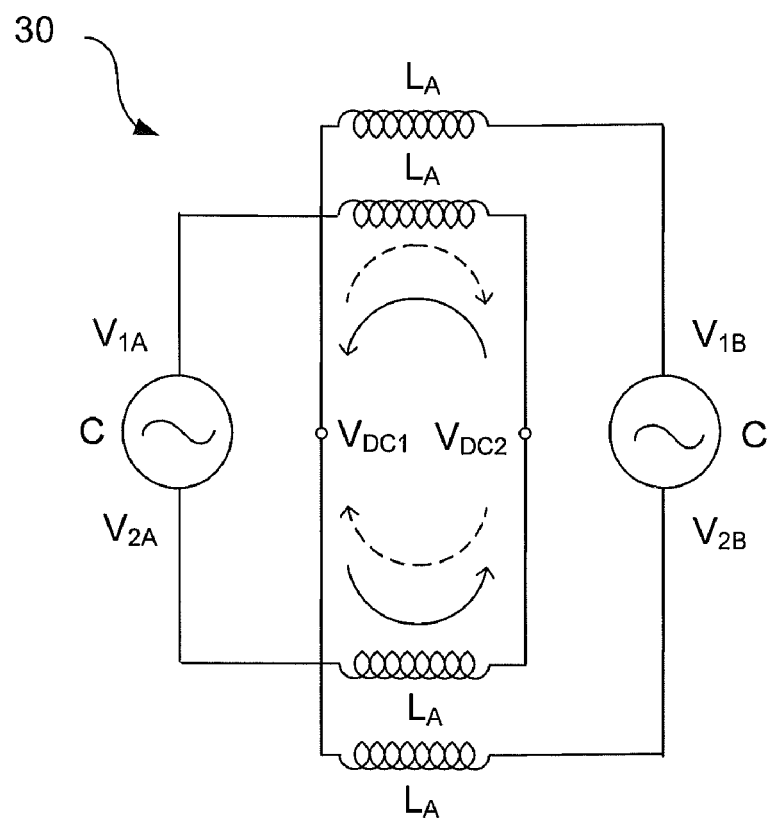
Fig. 4 - PRIOR ART

LOW NOISE OSCILLATOR

CROSS REFERENCE TO RELATED APPLICATION

This application is a 35 U.S.C. §371 national stage application of PCT International Application No. PCT/SE2011/050601, filed on 11 May 2011, the disclosure and content of which is incorporated by reference herein in its entirety.

TECHNICAL FIELD

The invention relates in general to frequency synthesis and in particular to an oscillator for use in generating a signal having a desired frequency. The invention also relates to a frequency synthesizer comprising such an oscillator for performing the signal generation and to a network node for use in a wireless communications network.

BACKGROUND

A frequency synthesizer may generally be described as an electronic system for generating any of a range of frequencies from a reference signal having a particular frequency. Frequency synthesizers may be found in many different kinds of devices, such as radio transceivers, mobile telephones, mobile radio base stations, satellite transceivers, GPS systems, etc.

In for example a mobile radio application, a signal to be used when transmitting and receiving data is conventionally generated by a frequency synthesizer comprising a phase-locked loop (PLL). A PLL frequency synthesizer may for example have a reference signal with a certain frequency as input, and a programmable counter which may generate a comparison signal by dividing an output signal outputted from the PLL frequency synthesizer. The output signal from the PLL frequency synthesizer may be an output signal outputted from an oscillator also comprised in the PLL frequency synthesizer. The PLL frequency synthesizer may further comprise a phase comparator for comparing the phase of the input reference signal with the phase of the comparison signal from the programmable counter and produce an output signal in dependence of this phase difference. From this output signal, a control signal (e.g. a tuning voltage) may be generated and used as input to the oscillator in order for the oscillator to generate and output an output signal having a specific frequency. This is the output signal outputted from the PLL synthesizer.

The PLL and the oscillator comprised in the PLL frequency synthesizer may be designed for different type of applications, some which have high requirements on the noise performance of the output signal and other applications with relative low requirements on the noise performance of the output signal. Examples of applications with high requirements on the noise performance of the output signal are network units or nodes, such as, for example, mobile radio base stations. Examples of applications with low requirements on the noise performance of the output signal are terminal units, such as, for example, mobile telephone applications. However, many oscillators implemented today result in signal-to-noise ratios on the output signal outputted from the PLL frequency synthesizer that does not fulfill the increasingly higher requirements on the noise performance of many existing and new emerging applications on the market. Thus, there is a demand for oscillators with improved noise performance.

Also, the PLL in a high performance PLL frequency synthesizer is conventionally designed as an integrated circuit (IC), while the oscillator in the PLL frequency synthesizer is designed using discrete electrical components, such as, e.g. transistors, capacitors, inductors, etc. Using different technologies such as an integrated PLL circuit and a discrete component oscillator to form a PLL frequency synthesizer does not enable a compact solution from a miniaturization perspective, as well as it does not provide a particularly cost effective solution from a manufacturing standpoint. These are also important factors in contemporary design of various telecommunication and radio network applications.

SUMMARY

It is an object to obviate at least some of the above disadvantages and achieve an integrated oscillator with improved noise performance.

Accordingly, an oscillator for use in generating a signal having a desired frequency in a frequency synthesizer is provided. The oscillator comprises: a first inductor element being electrically coupled from one end of a first capacitive element to a first voltage connection point; a second inductor element being electrically coupled from one end of a second capacitive element to a second voltage connection point; a third inductor element being electrically coupled from the other end of the first capacitive element to the first voltage connection point; a fourth inductor element being electrically coupled from the other end of the second capacitive element to the second voltage connection point; said inductor elements being arranged such that a conductive trace loop formed by the first and third inductor elements is interleaved with a conductive trace loop formed by the second and fourth inductor elements such that said conductive trace loops are configured to operate in substantially the same magnetic field, wherein a first drive circuit is electrically coupled to the first and second inductor element forming a first resonance circuit with the first and second capacitive elements and a second drive circuit is electrically coupled to the third and fourth inductor element forming a second resonance circuit with the first and second capacitive elements, such that the first and second drive circuits are mutually configured to establish and maintain a unified oscillation in the first and second resonance circuits at the desired frequency.

Since the drive circuits, normally comprising cross-coupled differential transistor pairs, have a maximum operating voltage that is usually lower than the maximum operating voltage of the capacitive elements, it has been found that it is the voltage swing over the drive circuits that primarily set the limit for the voltage swing at which the oscillator operate. In conventional coupled oscillators, the drive circuits are connected in parallel with the capacitive elements resulting in that the drive circuits will experience the full voltage swing of the oscillator. However, in the oscillator described above, the drive circuits are advantageously arranged to provide energy into the oscillator in a way such that the voltage swing experienced by the drive circuits are below the normal full voltage swing experienced by the drive circuits in conventional coupled oscillators. Thus, the drive circuits in the oscillator described above may operate at lower voltages, while the capacitive elements may operate at higher voltages than before. This will allow a higher voltage level to be used in the oscillator and consequently more energy to be stored in the oscillator. This will generate a more stable unified oscillation in the oscillator and result in lower phase noise in the output signal of the oscillator. Hence, an oscillator with improved noise performance is achieved which is capable of being integrated in an IC-circuit.

According to an illustrative embodiment, the drive circuits may be arranged substantially half-way between the capacitive elements along the inductor elements at a location where the voltage swing is approximately half of the full voltage swing of the oscillator. Thus, the voltage level that may be used for the capacitive elements in the oscillator may be increased by two, which allows the energy storage in the oscillator to be significantly increased, and thus result in improved phase noise of the output signal of the oscillator.

Another advantage of the oscillator is that the oscillator remains more linear as the influence of un-linearities in the drive circuits is reduced when the drive circuits operate at lower voltage swing. A more linear oscillator will result in less conversion of tail current noise into phase noise, whereby noise performance of the oscillator is further improved.

The first drive circuit may comprise a first transistor, the first transistor being configured such that the collector is electrically coupled to the second inductor element and the base is electrically coupled to the first inductor element, and a second transistor, the second transistor being configured such that the collector is electrically coupled to the first inductor element and the base is electrically coupled to the second inductor element; and the second drive circuit comprise a third transistor, the third transistor being configured such that the collector is electrically coupled to the fourth inductor element and the base is electrically coupled to the third inductor element, and a fourth transistor, the fourth transistor being configured such that the collector is electrically coupled to the third inductor element and the base is electrically coupled to the fourth inductor element. This advantageously provides an example of how the drive circuits may be electrically connected to the inductor elements in order to be mutually configured to establish and maintain a unified oscillation in the first and second resonance circuits at the desired frequency.

The oscillator may further comprise a first inductor element interconnect configured to provide an electrical connection across the conductive trace loops formed by the inductor elements such that undesired oscillation is suppressed in the oscillator. This advantageously provides electrical connections which achieve a suppression of undesired in-phase oscillations while not affecting the desired oscillation as the electrical connection across the conductive trace loops will be orthogonal to the currents flowing in the inductor elements.

The first inductor element interconnect may be configured to provide an electrical connection between the first voltage connection point on the conductive trace loop formed by the first and third inductor elements and the second voltage connection point on the conductive trace loop formed by the second and fourth inductor elements. This advantageously provides an example of how the first inductor element interconnect across the conductive trace loops may be connected to the inductor elements in order to provide the electrical connection that achieves the suppression of undesired in-phase oscillations, while not affecting the desired oscillation.

The oscillator may further comprise a second and third inductor element interconnect that may be configured to provide electrical connections across the conductive trace loops formed by the inductor elements such that undesired oscillation is further suppressed in the oscillator. This advantageously provides electrical connections which achieve a further suppression of undesired in-phase oscillations in the oscillator.

The second inductor element interconnect may be configured to provide an electrical connection between a first point on the second inductor element being substantially electrically equivalent to the collector of the first transistor, and a second point on the third inductor element being substantially electrically equivalent to the collector of the fourth transistor; and the third inductor element interconnect may be configured to provide an electrical connection between a first point on the first inductor element being substantially electrically equivalent to the collector of the second transistor, and a second point on the fourth inductor element being substantially electrically equivalent to the collector of the third transistor. This advantageously provides an example of how the second and third inductor element interconnect across the conductive trace loop may be connected to the inductor elements in order to achieve the electrical connections which achieve the further suppression of undesired in-phase oscillations in the oscillator.

The oscillator may further comprise at least a first, second, third and fourth additional inductor element connected to the first, second, third and fourth inductor elements such that the inductance of the oscillator is reduced. This advantageously allows for a higher current to be used in the oscillator and more energy to be stored in the oscillator, and consequently result in lower phase noise in the output signal of the oscillator.

Also, an additional advantage is that by reducing the inductance, the voltage swing over the drive circuits in the oscillator is also reduced. This will further improve the linearity of the oscillator and result in less conversion of tail current noise into phase noise.

The at least one first additional inductor element may be connected to the first inductor element and the first voltage connection point to form a partial outer conductive trace loop, said partial outer conductive trace loop being coupled in parallel with a part of the first inductor element; the at least one second additional inductor element may be connected to the second inductor element and the second voltage connection point to form a partial outer conductive trace loop, said partial outer conductive trace loop being coupled in parallel with a part of the second inductor element; the at least one third additional inductor element may be connected to the third inductor element and the first voltage connection point to form a partial outer conductive trace loop, said partial outer conductive trace loop being coupled in parallel with a part of the third inductor element; and the at least one fourth additional inductor element may be connected to the fourth inductor element and the second voltage connection point to form a partial outer conductive trace loop, said partial outer conductive trace loop being coupled in parallel with a part of the fourth inductor element. This advantageously provides an example of how the first, second, third and fourth additional inductor element may be connected to the first, second, third and fourth inductor elements in order to achieve the reduced inductance.

The oscillator may further comprise at least a third and a fourth drive circuit, at least a third and a fourth capacitive element, and at least fifth, sixth, seventh and eight inductor elements which may be configured to form at least a third and a fourth resonance circuit and being arranged to be electrically coupled to the first and second drive circuit, the first and second capacitive element, and the first, second, third and fourth inductor elements, such that the first and second drive circuits and the at least third and fourth drive circuits are mutually configured to establish and maintain a unified oscillation in the first, second, at least third and at least fourth resonance circuits at the desired frequency. This advantageously provides scalability to the oscillator by in a corresponding manner provide further resonance circuits arranged to be mutually configured to establish and maintain a unified oscillation together with the first and second resonance circuits at the desired frequency. The number of resonance circuits that may be comprised in the oscillator according to the invention may be any number of resonance circuit pairs. For each resonance circuit pair added to the oscillator, the inductance of the oscillator may be lowered and the capacitance of the oscillator may be increased allowing more energy to be stored in the oscillator and resulting in even further improved noise performance.

The oscillator may further comprise a fourth inductor element interconnect, wherein the fourth inductor element interconnect and the first inductor element interconnect may be configured to provide an electrical connection across the conductive trace loops formed by the inductor elements such that undesired oscillation is suppressed in the oscillator. In the similar manner as described above for the first inductor element, this advantageously provides electrical connections which achieve a suppression of undesired in-phase oscillations in the above described oscillator, while not affecting the desired oscillation as the electrical connection across the conductive trace loops will be orthogonal to the currents flowing in the inductor elements.

The oscillator may further comprise a fifth and sixth inductor element interconnect, wherein the fifth and sixth inductor element interconnects and the second and third inductor element interconnects may be configured to provide electrical connections across the conductive trace loops formed by the inductor elements such that undesired oscillation is further suppressed in the oscillator. In the similar manner as described above for the second and third inductor element interconnects, this advantageously provides electrical connections which achieve a further suppression of undesired in-phase oscillations in the above described oscillator.

The transistors may be NPN-transistors, MOS-transistors or any other suitable transistors. The capacitive elements may comprise at least one or more capacitors which may be digitally programmable and/or tunable, wherein the at least one or more capacitors may be MIM-capacitors or any other suitable capacitors.

A further advantage of the oscillator according to the various embodiments described above is that by providing such an improved noise performance, it will be possible to increase the frequency bandwidth of the oscillator by using, for example, a programmable capacitive circuit, whereby the oscillator enables the implementation of a software controlled, programmable multiband radio equipment.

A further advantage of the oscillator is that the oscillator as described above may be formed as an integrated circuit (IC) and may be integrated on a single die.

Another further advantage of the oscillator is that it may be used in a frequency synthesizer comprising a phase-locked loop (PLL) for generating frequencies, and an oscillator according to any one of the embodiments described above. The frequency synthesizer may also be arranged to form an integrated, single chip frequency synthesizer with the oscillator by having the PLL and the oscillator being integrated on the same die.

Yet a further advantage of the oscillator is that the oscillator may be used in a network node for use in a telecommunications network. The network node may comprise an oscillator and/or a frequency synthesizer according to the above. The network node may be a mobile radio base station.

BRIEF DESCRIPTION OF THE DRAWINGS

The above and other features and advantages of the present invention will become readily apparent to those skilled in the art by the following detailed description of exemplary embodiments thereof with reference to the accompanying drawings, wherein:

FIG. 1 schematically illustrates an oscillator according to prior art,

FIG. 2 schematically illustrates an electrical circuit representation equivalent to the oscillator shown in FIG. 1, FIG. 3 schematically illustrates a coupled oscillator according to prior art, FIG. 4 schematically illustrates an electrical circuit representation equivalent to the coupled oscillator shown in FIG. 3, FIG. 5 schematically illustrates an oscillator according to an embodiment of the invention, FIG. 6 schematically illustrates an electrical circuit representation equivalent to the oscillator according to the embodiment of the invention shown in FIG. 5, FIG. 7A-7B are graphs schematically illustrating exemplary AC-voltage and current relations in the oscillator according to an embodiment of the invention shown in FIGS. 5-6, FIG. 8 schematically illustrates an oscillator according to another embodiment of the invention, FIG. 9 schematically illustrates an oscillator according to yet another embodiment of the invention, FIG. 10 schematically illustrates an oscillator according to a further embodiment of the invention, FIG. 11 schematically illustrates an oscillator according to yet a further embodiment of the invention, FIG. 12 schematically illustrates an electrical circuit representation equivalent to the oscillator according to the embodiment of the invention shown in FIG. 10.

DESCRIPTION

Figure 5:
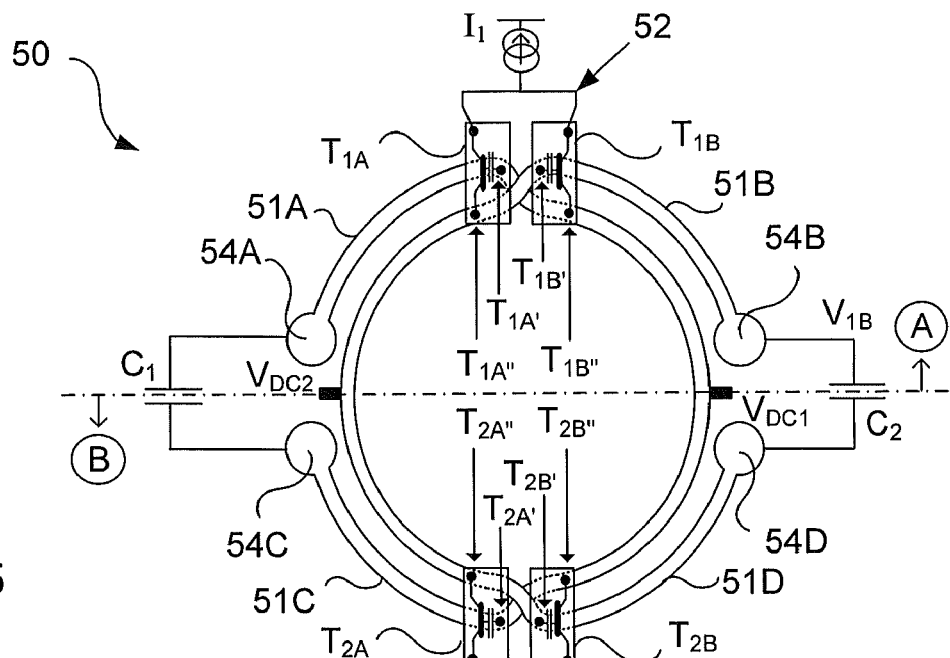

FIG. 1 illustrates a typical voltage controlled oscillator (VCO). A voltage controlled oscillator (VCO) is a frequency-varying oscillation circuit that changes its output frequency according to a tuning voltage (Vtune). The varying range of the frequency is determined according to its specific purposes. A VCO may generate an output signal oscillating at a frequency determined in accordance with the tuning voltage which may be supplied from an external unit. In the case of use in a frequency synthesizer, this tuning voltage may be based on an output signal from a phase detector of a phase locked loop (PLL).

In FIG. 1, the VCO 10 comprises an inductor element 11 and a capacitive circuit 12. The inductor element 11 and the capacitive circuit 12 of the VCO 10 together form a resonance circuit. The capacitive circuit 12 normally comprises one or several capacitive elements C 16, such as, for example, variable capacitors (varactors) for shifting the resonant frequency of the resonance circuit according to the tuning voltage, and a drive circuit or electrical components arrangement 17, 18 arranged to establish and maintain the oscillation in the VCO 10. The drive circuit 17, 18 of the capacitive circuit 12 normally comprise a cross-coupled differential pair of transistors 17 arranged to generate a negative resistance component, and a current source 18 arranged to draw a current I from the cross-coupled differential pair of transistors 17 in the capacitive circuit 12. The capacitive circuit 12 of the VCO 10 may be arranged with tuning voltage terminals (not shown) through which a tuning voltage is arranged to be received, and output terminals (not shown) from which an output from the VCO 10 is arranged to be outputted.

In the VCO 10, the inductor element 11 may be made as a conductive trace loop. The conductive trace loop of the inductor element 11 may comprise one or more turns of a conductive material, such as, for example, metal. In order for the inductor element 11 to be used in an electronic circuit, electrical connection terminals 15 may be connected to the conductive trace loop. The inductor value of the inductive element 11 may be determined by physical characteristics, such as, for example, the length, size and shape of the conductive trace loop. The inductor value may be scaled down by making the physical size of the conductive trace loop smaller. Since, as previously mentioned, the VCO 10 is often limited to a particular voltage level because of the limited maximum operating voltage of the capacitive elements C 16 or the drive circuit 17, 18 comprised in the capacitive circuit 12, a reason for scaling down the inductor value and making the physical size of the conductive trace loop smaller is to keep the voltage swing low so as to not destroy the capacitive elements C 16 or the drive circuit 17, 18. However, if the size of the conductive trace loop is made too small, the Q value of the inductor element 11 will degrade. This is because the magnetic coupling across the turn(s) of the conductive trace loop will become larger when currents traveling in opposite directions come closer to each other. This magnetic coupling or counteraction across the conductive trace loop will make the inductance value of the inductor element 11 decrease, but the losses will still remain and result in that the Q value of the inductor element 11 will degrade. Thus, it should be noted that there are restrictions and limitations on the size of conductive trace loop of the inductor element 11 when trying to achieve an oscillator with an improved noise performance.

The capacitive circuit 12 is connected to the inductor element 11 through the electrical connection terminals 15. The VCO 10 is thus arranged to oscillate at the resonance frequency of the resonance circuit consisting of the inductor element 11 and the capacitive circuit 12 coupled in parallel. This will place a virtual ground at a virtual ground point 13 of the inductor element 11 on the opposite side of from the electrical connection terminals 15 of the capacitive circuit 12. The virtual ground point 13 may here also be arranged to receive a DC supply voltage $V_{DC}$ (which is commonly also denoted VCC). Because of various losses, energy constantly has to be provided to keep the oscillation in the resonance circuit going. If not, the amplitude of the oscillation will gradually decrease and eventually fade out. This energy is provided to the VCO 10 by the drive circuit 17, 18.

FIG. 2 shows a schematic electrical circuit representation of the VCO 10 illustrated in FIG. 1. The inductor element 11 is here represented by the inductors L and the capacitive circuit 12 is represented by a variable capacitor C. The virtual ground point 13 is also shown. As oscillation is established in the resonance circuit, i.e. the LC circuit 10 in FIG. 2, current will flow from a first side of the variable capacitor C through a first one of the inductors L towards the virtual ground point 13 and from the virtual ground point 13 through the second one of the inductors L towards the second side of the variable capacitor C. This is illustrated by the fully drawn arrows in FIG. 2. The inherent properties of the resonance circuit will then cause the direction of the currents to swing, whereby current will flow from the second side of the variable capacitor C through the second one of the inductors L towards the virtual ground point 13 and from the virtual ground point 13 through the first one of the inductors L towards the first side of the variable capacitor C. This is illustrated by the dashed arrows in FIG. 2. Thus, the resonance circuit will store electrical energy by swinging back and forth (oscillating) between electrical charge in the variable capacitor C and magnetic field around the inductors L. The oscillation will swing around the virtual ground point 13 at the resonant frequency of the resonance circuit. Because of the resonance circuit's ability to store this alternating (oscillating) energy, the LC circuit 10 is often referred to as a "tank".

The resonance frequency, $f_R$, of the LC circuit in FIG. 2 is determined according to Eq. 1:

$$f_R = \frac{1}{2\pi\sqrt{2L \cdot C}} \qquad (\text{Eq. 1})$$

Thus, by varying the capacitance of the variable capacitor C, the resonance frequency $f_R$ may be varied. The VCO 10 may use variable capacitors (varactors) responsive to a received tuning voltage for varying the capacitance of the resonance circuit, and thus shift the resonant frequency $f_R$ of the resonance circuit according to the received tuning voltage. It can also be concluded that the AC-voltages at the connection terminals 15 of the capacitive circuit 12 relate to each other as $V_2=-V_1$.

However, there are some drawbacks accompanying the implementation of the above described VCO 10. First, the signal-to-noise ratio of the oscillator output of the VCO 10 does not satisfy the high noise performance requirements of certain telecommunication network applications, such as, for example, the desired signal-to-noise ratio of signals in a mobile radio base station application or a similar network unit or node. A reason for this is because when implementing the VCO 10 on an integrated circuit (IC) this will result in higher losses and a degraded Q value in the inductor element 11 and in the capacitive circuit 12 as compared to an implementation of the VCO 10 using discrete electrical components. Thus, in order to achieve an oscillation with a particular frequency and noice performance and overcome the resulting losses in the VCO 10, more energy needs to be inputted and stored in the VCO 10. Inputting more energy into the VCO 10 will, however, result in that the maximum operating voltage of the capacitive elements C 16 and/or the electrical components arrangement 17, 18 in the capacitive circuit 12 are exceeded.

This issue may be addressed by designing the VCO 10 using normal discrete electrical components, such as, i.e. transistors, capacitors, inductors, etc. However, discrete electrical components have set values and thus have to be chosen so as to optimize the VCO 10 for the frequency band that it is to be designed for in order to provide good performance. It follows that the VCO 10 is limited to a particular narrow frequency band. This does not provide a particularly flexible solution, since it results in that changing frequency band of the VCO 10 entails a complete redesign and exchange of the discrete electrical components. It also follows that this solution is not particularly cost effective, since designing (or re-designing), handling and manufacturing electrical circuits using discrete electrical components is an expensive process. It is also not a particular beneficial solution from a miniaturization perspective, since discrete electrical components require more physical space than components implemented on an integrated circuit.

Instead, in order to increase the energy storage in the VCO 10, a coupled oscillator as shown in FIGS. 3-4 may be used.

FIG. 3 schematically illustrates a coupled oscillator 30. The coupled oscillator 30 basically comprises two VCOs 10 that have their inductive elements 11 placed on top of each other. By doing so, the inductive elements 11 of the two VCOs 10 are interleaved such that the two VCOs 10 operate in the same magnetic field. Because of the magnetic coupling between the inductor elements 11 of the two VCOs 10, the currents in the inductor elements 11 of the two VCOs 10 lock each other in phase, i.e. are phase-locked. This means that if one of the VCOs 10 in the coupled oscillator 30 is drifting in phase, the other one of the VCOs 10 in the coupled oscillator 30 will induce a current that pulls the currents back into the same phase. As the currents in both of the VCOs 10 in the coupled oscillator 30 are in the same phase, a stable operating point is achieved. Thus, the coupled oscillator 30 forms a unified oscillating system where the energy is distributed into several resonance circuits or "tanks". This unified oscillating system will comprise higher energy storage due to the increased total capacitance, as compared to a single VCO 10, without compromising with the Q value of the inductor element 11.

FIG. 4 schematically illustrates an electrical circuit representation equivalent to the coupled oscillator 30 shown in FIG. 3. Besides the current induced if one of the VCOs 10 in the coupled oscillator 30 is drifting in phase, both of the VCOs 10 in the coupled oscillator 30 operate in a similar manner as described for the single VCO 10 in reference to FIGS. 1-2. As the currents in the inductor elements 11 of the two VCOs 10 are locked in phase, it may also be concluded that the AC-voltages at the connection terminals 15 of the capacitive circuits 12 in the coupled oscillator 30 relate to each other as $V_{1A}=V_{2B}=-V_{1B}=-V_{2A}$.

However, even the coupled oscillators 30 are not capable of storing a high enough energy to achieve some of the high requirements of noise performance in certain areas of applications.

FIG. 5 schematically illustrates an oscillator 50 according to an embodiment of the invention. The oscillator 50 may, for example, be used for generating a signal having a desired frequency in a frequency synthesizer.

Instead of as in conventional VCOs 10 or coupled oscillator 30 having the drive circuits 17, 18 electrically coupled in parallel with the capacitive elements C 16 in a capacitive circuit 12 as shown in FIG. 1-4, a first drive circuit 52 is coupled to a first and second inductive elements 51A, 51B at a point halfway, or at least substantially half-way, between a first capacitive element $C_1$ and a second capacitive element $C_2$. The first drive circuit 52 may comprise a first transistor $T_{1A}$ and a second transistor $T_{1B}$ arranged to generate a negative resistance component, and a first tail current DC source $I_1$ arranged to draw a current from the first and second transistors $T_{1A}$, $T_{1B}$. Correspondingly, a second drive circuit 53 is coupled to a third and fourth inductive elements 51C, 51D at a point halfway, or at least substantially half-way, between the same first capacitive element $C_1$ and second capacitive element $C_2$. The second drive circuit 53 may comprise a third transistor $T_{2A}$ and a fourth transistor $T_{2B}$ arranged to generate a negative resistance component, and a second tail current DC source $I_2$ arranged to draw a current I from the third and fourth transistors $T_{2A}$, $T_{2B}$. The capacitive elements $C_1$, $C_2$ may comprise one or more capacitors, which may be programmable or digitally variable and tunable.

The coupling of the first drive circuit 52 to the first and second inductive elements 51A, 51B forms a first resonance circuit A (i.e. the upper part of the oscillator 50 as indicated by the dashed dotted line) with the first capacitive element $C_1$ and the second capacitive element $C_2$, and the coupling of the second drive circuit 53 to the third and fourth inductive elements 51C, 51D forms a second resonance circuit B (i.e. the lower part of the oscillator 50 as indicated by the dashed dotted line) with the same first and second capacitor $C_1$ and $C_2$. The first and second drive circuits 52, 53 are mutually configured to establish and maintain a unified oscillation in the first and second resonance circuits A, B at the desired frequency.

According to one example and as shown by the oscillator 50 in FIG. 5, the first drive circuit 52 may comprise the first transistor $T_{1A}$ of the first drive circuit 52 being arranged such that the collector $T_{1A''}$ of the first transistor $T_{1A}$ is electrically coupled to the second inductor element 51B and the base $T_{1A'}$ of the first transistor $T_{1A}$ is electrically coupled to the first inductor element 51A. The base $T_{1A'}$ may be electrically coupled to the first inductor element 51A through a capacitive element as can be seen in FIG. 5. The first drive circuit 52 may also comprise the second transistor $T_{1B}$ of the first drive circuit 52 being arranged such that the collector $T_{1B''}$ is electrically coupled to the first inductor element 51A and the base $T_{1B'}$ is electrically coupled to the second inductor element 51B. The base $T_{1B'}$ may be electrically coupled to the second inductor element 51B through a capacitive element. Correspondingly, the second drive circuit 53 may comprise the third transistor $T_{2A}$ of the second drive circuit 53 being arranged such that the collector $T_{2A''}$ is electrically coupled to the fourth inductor element 51D and the base $T_{2A'}$ is electrically coupled to the third inductor element 51C. The base $T_{2A'}$ may be electrically coupled to the third inductor element 51C through a capacitive element. The second drive circuit 53 may comprise the fourth transistor $T_{2B}$ of the second drive circuit 53 being arranged such that the collector $T_{2B''}$ is electrically coupled to the third inductor element 51C and the base $T_{2B'}$ is electrically coupled to the fourth inductor element 51D. The base $T_{2B'}$ may be electrically coupled to the fourth inductor element 51D through a capacitive element.

In the oscillator 50 in FIG. 5, the first inductor element 51A is an electrical coupling or connection from one end of the first capacitive element $C_1$, i.e. a connection terminal 54A, to a first virtual ground point, i.e. a first voltage connection point $V_{DC1}$. The third inductor element 51C is an electrical coupling or connection from the other end of the first capacitive element $C_1$, i.e. a connection terminal 54C, to the same first virtual ground point, i.e. the first voltage connection point $V_{DC1}$. The first inductor element 51A and the third inductor element 51C may thus form a first conductive trace loop. Also, the second inductor element 51B is an electrical coupling or connection from one end of the second capacitive element $C_2$, i.e. a connection terminal 54B, to a second virtual ground point, i.e. a second voltage connection point $V_{DC2}$. The fourth inductor element 51D is an electrical coupling or connection from the other end of the second capacitive element $C_2$, i.e. a connection terminal 54D, to the same second virtual ground point, i.e. the second voltage connection point $V_{DC2}$. The second inductor element 51B and the fourth inductor element 51D may thus form a second conductive trace loop. The first conductive trace loop formed by the first inductor element 51A and the third inductor element 51C is interleaved with the second conductive trace loop formed by the second inductor element 51B and fourth inductor element 51D. This causes first conductive trace loop to operate in substantially the same magnetic field as the second conductive trace loop.

It should be noted that in conventional oscillators, such as, for example, the VCO 10 and the coupled oscillator 30 shown in FIGS. 1-4, the drive circuits, i.e. the transistors 17 and the tail current DC source I 18, are connected in parallel with the capacitive elements C 16 resulting in that both the transistors 17 and the capacitive elements C 16 will experience the full voltage swing of the oscillator 10, 30. Thus, since the maximum operating voltage for the transistors 17 normally is lower than the maximum operating voltage for the capacitors C, a voltage level that generates a voltage swing at least below the maximum operating voltage for the transistors 17 must be selected in the oscillator 10, 30 in order to not destroy the transistors 17. In some cases, this may cause the capacitive elements C 16 to only use part of their potential storage capacity.

In the embodiment described above, the maximum operating voltage for the first and second transistor $T_{1A}$, $T_{1B}$ of the first drive circuit 52 and the third and fourth transistor $T_{2A}$, $T_{2B}$ of the second drive circuit 53 are also normally lower than the maximum operating voltage for the first and second capacitive elements $C_1$ and $C_2$. However, by being arranged as described above, the transistors $T_{1A}$, $T_{1B}$, $T_{2A}$, $T_{2B}$ of the first and second drive circuits 52, 53 are arranged to provide energy into the oscillator 50 in a way such that the voltage swing experienced by the transistors $T_{1A}$, $T_{1B}$, $T_{2A}$, $T_{2B}$ of the first and second drive circuits 52, 53 are approximately half the voltage swing experienced by the first and second capacitive elements $C_1$ and $C_2$. Thus, a higher voltage level that generates a voltage swing, for example, about two times larger, may be selected in the oscillator 50 without exceeding the maximum operating voltage of the transistors $T_{1A}$, $T_{1B}$, $T_{2A}$, $T_{2B}$ of the first and second drive circuits 52, 53. Consequently, more of the available storage capacity of the first and second capacitive elements $C_1$ and $C_2$ may be utilized. Hence, more energy may be stored in the oscillator 50 which will result in further improved noise performance in the oscillator 50.

Figure 6:
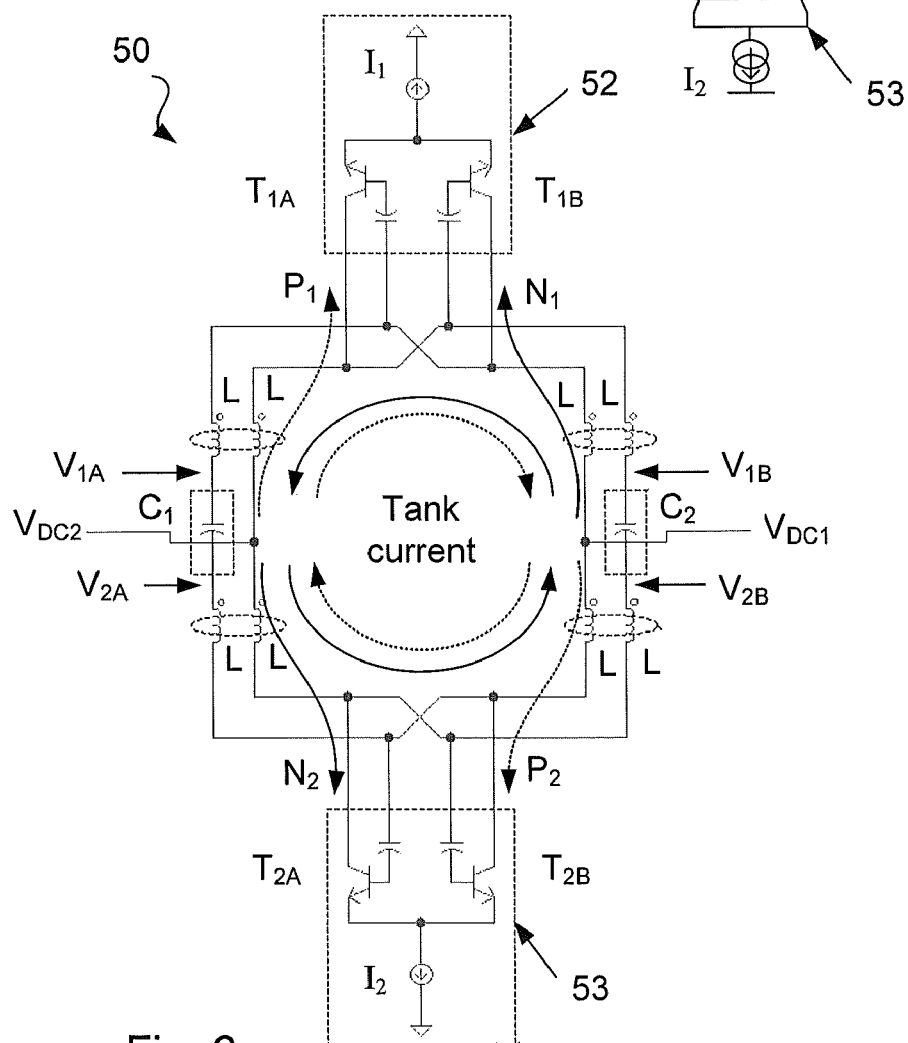

FIG. 6 schematically illustrates an electrical circuit representation equivalent to the oscillator 50 according to the embodiment shown in FIG. 5. The inductor elements 51A, 51B, 51C, 51D is here represented by tracks comprising inductors L (the areas indicated by the dashed lines illustrates parallel tracks with mutual inductance). The first drive circuit 52 comprising the first transistor $T_{1A}$, the second transistor $T_{1B}$ and the first tail current DC source $I_1$, and the second drive circuit 53 comprising a third transistor $T_{2A}$, a fourth transistor $T_{2B}$ and a second tail current DC source $I_2$ are shown. The first and second capacitive elements $C_1$ and $C_2$, and the first and second virtual ground points (i.e. the first and second voltage connection points $V_{DC1}$ and $V_{DC2}$) are also shown. The voltages at the connection terminals 54A, 54B, 54C, 54D of the first and second capacitive elements $C_1$, $C_2$ in the oscillator 50 are indicated by $V_{1A}$, $V_{1B}$, $V_{2A}$, $V_{2B}$, respectively.

As desired oscillation is established in the resonance circuits A and B, the drive current $N_1$ will flow from the virtual ground point $V_{DC1}$ through the collector $T_{1B''}$ of the second transistor $T_{1B}$ and towards the first tail current DC source $I_1$, and the drive current $N_2$ will flow from the virtual ground point $V_{DC2}$ through the collector $T_{2A''}$ of the third transistor $T_{2A}$ and towards the second tail current DC source $I_2$. This will cause the tank current illustrated by the fully drawn arrows in FIG. 6. The inherent properties of the resonance circuits A and B will then cause, at the next half-period of the AC-cycle, the direction of the drive currents to swing, whereby the drive current $P_1$ will flow from the virtual ground point $V_{DC2}$ through the collector $T_{1A''}$ of the first transistor $T_{1A}$ and towards the first tail current DC source $I_1$ and the drive current $P_2$ will flow from the virtual ground point $V_{DC1}$ through the collector $T_{2B''}$ of the fourth transistor $T_{2B}$ and towards the second tail current DC source $I_2$. This will cause the tank current illustrated by the dashed arrows in FIG. 6. Thus, the resonance circuits A and B will store electrical energy by swinging back and forth (oscillating) between electrical charge in the first and second capacitive elements $C_1$ and $C_2$, and magnetic field around the inductor elements 51A, 51B, 51C, 51D. The oscillation will swing around the virtual ground points $V_{DC1}$ and $V_{DC2}$ at the resonant frequency of the resonance circuits A and B.

Figure 7A:
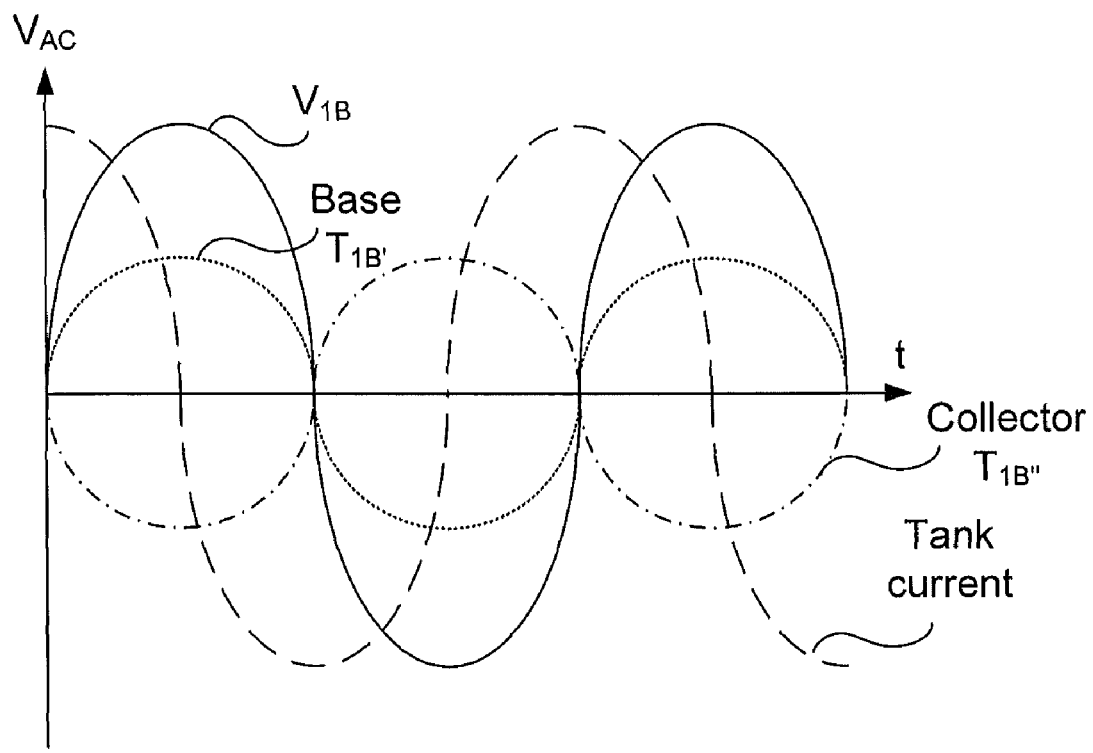
Figure 7B:
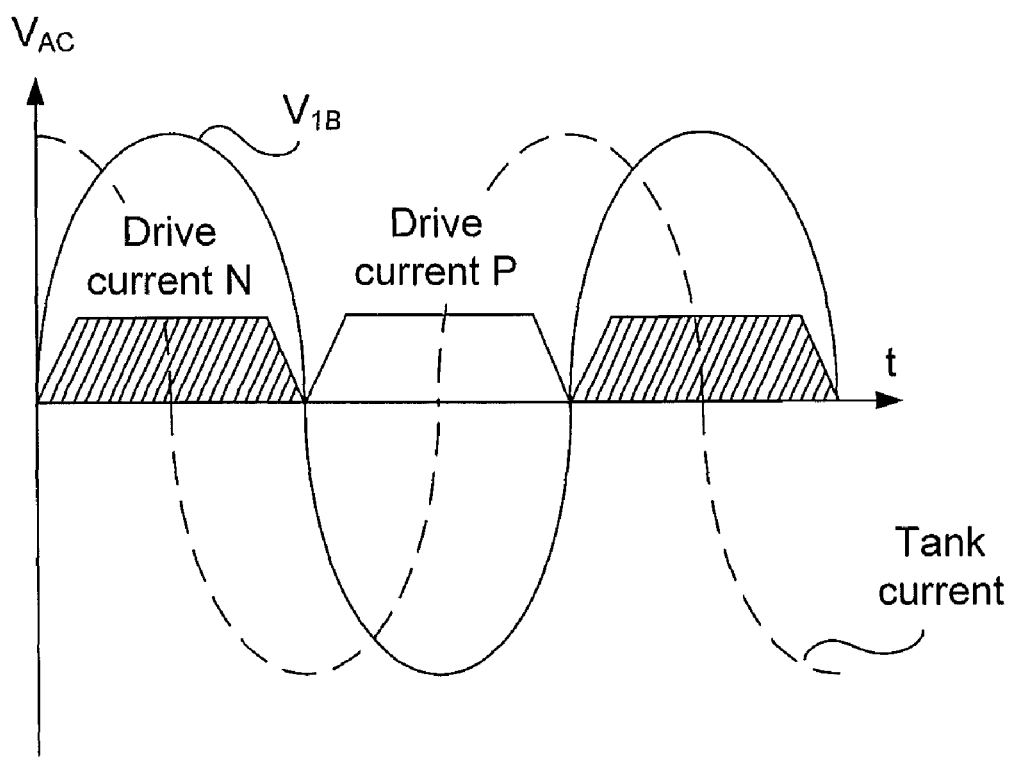

FIGS. 7A-7B are graphs schematically illustrating the theoretical AC-voltage and current relations in an oscillator, such as, for example, the oscillator 50 according to the embodiment shown in FIG. 5. In FIG. 7A, the graph illustrates the voltage level for the transistor $T_{1B}$ in the first drive circuit 52. The base $T_{1B'}$ of the transistor $T_{1B}$ will swing in phase with $V_{1B}$, but with approximately half of the amplitude of $V_{1B}$. The collector $T_{1B''}$ of the transistor $T_{1B}$ will also swing with approximately half amplitude of the amplitude of $V_{1B}$, but with the opposite phase, that is, out of phase with $V_{1B}$. Simultaneously and with the same amplitudes, the base $T_{1A'}$ of the other transistor $T_{1A}$ in the first drive circuit 52 will swing out of phase compared to the base $T_{1B'}$, and the collector $T_{1A''}$ will swing out of phase compared to the collector $T_{1B''}$. This forms a differential stage where the tail current I is toggled trough either the first transistor $T_{1A}$ or the second transistor $T_{1B}$. A corresponding graph may, for example, be used to illustrate the voltage level for the transistor $T_{2B}$ in the second drive circuit 53 in the same way.

In FIG. 7B, the graph illustrates how the tail current I is toggled through either the first transistor $T_{1A}$ or the second transistor $T_{1B}$ to form the drive currents N or P that injects, i.e. provides, energy into the oscillator 50 in synchronization with the AC voltage swing. During one half of a period, energy is injected trough the drive current P, that is, $P_1$ and $P_2$ shown in FIG. 6, and in the following subsequent half of the period, energy is injected trough the drive current N, that is, $N_1$ and $N_2$ also shown in FIG. 6. Seen from the virtual ground points $V_{DC1}$ and $V_{DC2}$ (where the drive currents originates), the drive currents N and P will toggle upwards/downwards driven by the oscillation, but the total current drawn from each of the virtual ground points $V_{DC1}$ and $V_{DC2}$ will be constant, that is, DC (=the tail current I).

Figure 8:
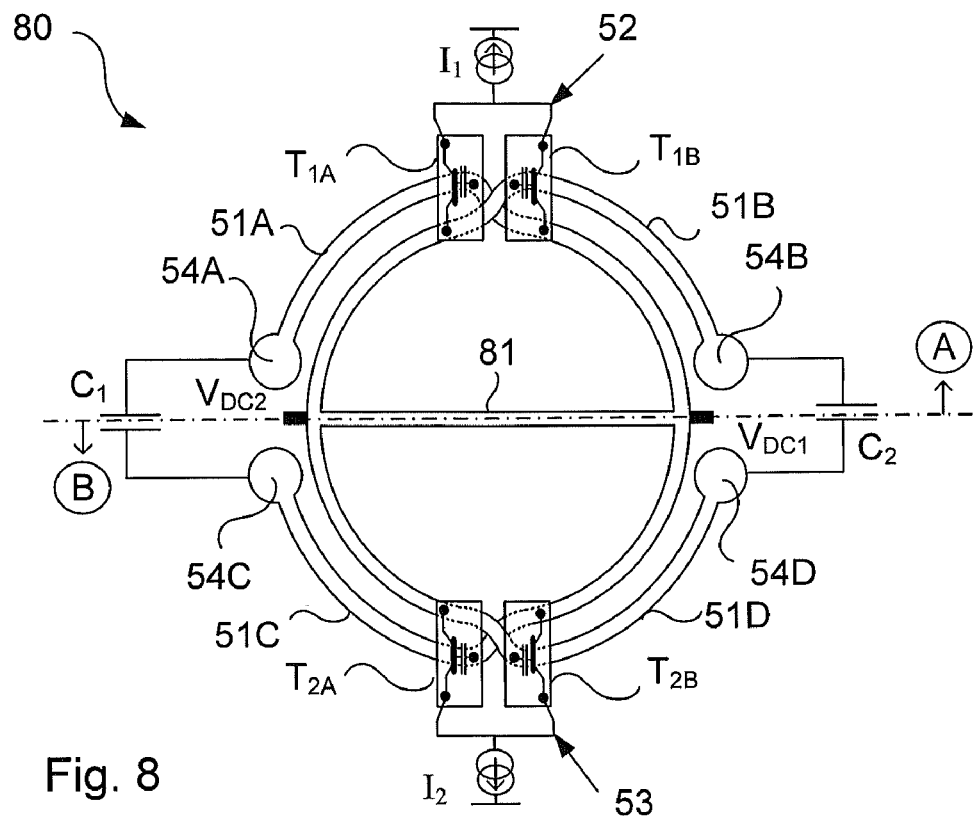

FIG. 8 schematically illustrates an oscillator according to another embodiment of the invention. The oscillator 80 may be substantially the same as the oscillator 50 described in the previous embodiment with reference to FIG. 5, except in that the oscillator 80 further may comprise a first inductor element interconnect 81.

Apart from the desired oscillation mode of the oscillator 50 described above with reference to FIG. 6, there may also be an undesired oscillation mode in the oscillator 50, i.e. an in-phase oscillation mode. This undesired in-phase oscillation mode may appear because of, for example, the capacitance between the first and second transistor $T_{1A}$, $T_{1B}$ in the first drive circuit 52 and/or the capacitance between the third and fourth transistor $T_{2A}$, $T_{2B}$ in the second drive circuit 53, and an inductance formed between the virtual ground points $V_{DC1}$ and $V_{DC2}$ through the DC voltage supply network. The DC voltage supply network is connected to the oscillator 50 at the virtual ground points $V_{DC1}$ and $V_{DC2}$. In such an undesired in-phase oscillation mode, the tank currents in the upper and lower part A and B of the oscillator 50 may flow in the same direction in the oscillator 50 as oppose to the alternating directions of the tank currents as described above with reference to FIG. 6.

For example, a tank current may flow from one side 54A of the first capacitive element $C_1$ towards the virtual ground point $V_{DC1}$ at the same time as another tank current may flow from the other side 54C of the first capacitive element $C_1$ towards the same virtual ground point $V_{DC1}$. These tank currents will thus merge "in-phase" at the virtual ground point $V_{DC1}$ and proceed out through the DC voltage supply network that is connected to the oscillator 50 and back towards the other virtual ground points $V_{DC2}$. As the inductance of the path through the DC voltage supply network may be relatively large, the resonance frequency of the undesired in-phase oscillation is likely to be lower than the resonance frequency of the desired oscillation mode. Thus, this may cause the oscillator 50 to produce the wrong or even two frequencies in the output signal.

As seen in FIG. 8, the oscillator 80 comprises a first inductor element interconnect 81 that is electrically coupled between the first voltage connection point $V_{DC1}$ on the conductive trace loop formed by the first and third inductor elements 51A, 51C and the second voltage connection point $V_{DC2}$ on the conductive trace loop formed by the second and fourth inductor elements 51B, 51D. Thus, this horizontal first inductor element interconnect 81 provide an alternative current path having a lower inductance for the undesired in-phase oscillation than the path through the DC voltage supply network. The first inductor element interconnect 81 may be seen as providing two further conductive trace loops with lower inductance for the currents of the undesired in-phase oscillation. The first conductive trace loop is formed between the first transistor $T_{1A}$ and the second transistor $T_{1B}$ over the first inductor element interconnect 81, passing through the first and second voltage connection point $V_{DC1}$, $V_{DC2}$. The second conductive trace loop is formed between the third transistor $T_{1C}$ and the fourth transistor $T_{1D}$ over the first inductor element interconnect 81, passing through the first and second voltage connection point $V_{DC1}$, $V_{DC2}$. The undesired in-phase oscillation mode will experience a lower Q-value than the desired oscillation mode. This will suppress the oscillation of the undesired in-phase oscillation mode.

Thus, the first inductor element interconnect 81 is configured to provide an electrical connection across the conductive trace loops of the oscillator 80 such that undesired oscillation is suppressed in the oscillator 80. It should also be noted that the electrical connection provided by the first inductor element interconnect 81 is orthogonal to the currents flowing in the inductive elements and thus will not affect the desired oscillation in the oscillator 80.

Figure 9:
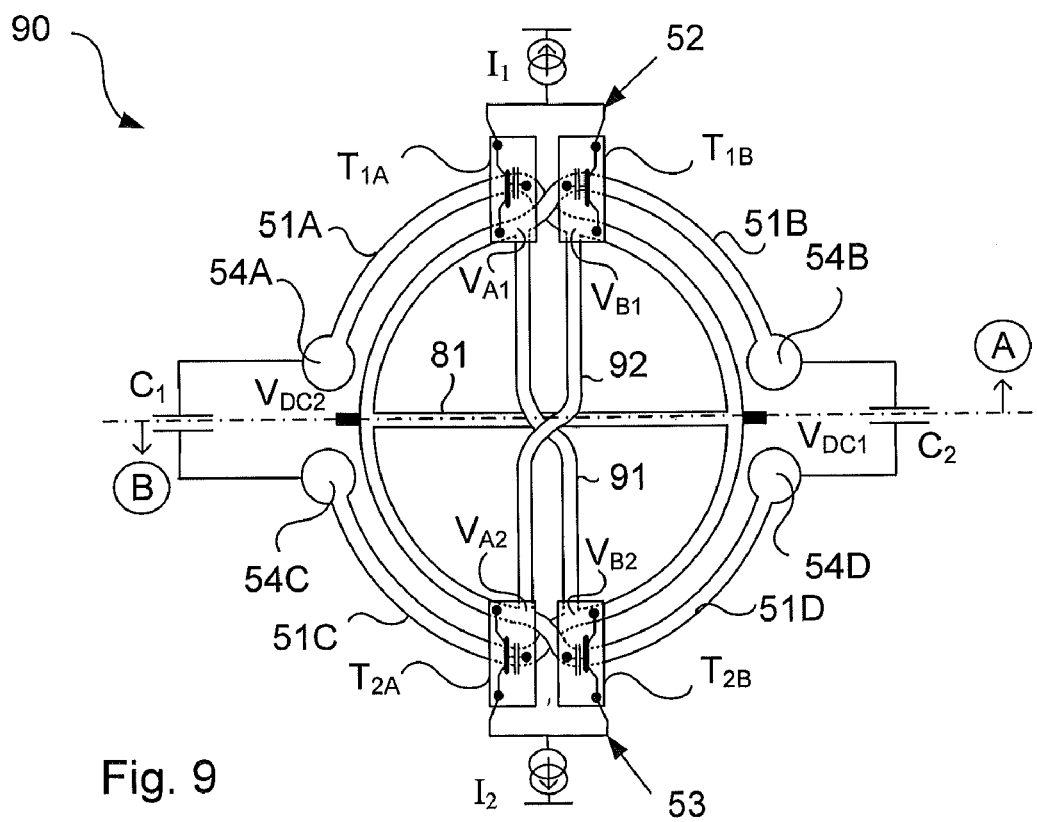

FIG. 9 schematically illustrates an oscillator 90 according to yet another embodiment of the invention. The oscillator 90 may be substantially the same as the oscillator 50 described in the previous embodiment with reference to FIG. 5 or the oscillator 80 described in the previous embodiment with reference to FIG. 8, except in that the oscillator 90 further may comprise a second and third inductor element interconnect 91, 92.

In FIG. 9, the oscillator 90 comprises a second inductor element interconnect 91 that is electrically coupled between a first point $V_{A1}$ on the second inductor element 51B and a second point $V_{B2}$ on the third inductor element 51C. The first point $V_{A1}$ on the second inductor element 51B is substantially electrically equivalent to the collector $T_{1A''}$ of the first transistor $T_{1A}$ and the base $T_{1B'}$ of the second transistor $T_{1B}$. The second point $V_{B2}$ on the third inductor element 51C is substantially electrically equivalent to the collector $T_{2B''}$ of the fourth transistor $T_{2B}$ and the base $T_{2A'}$ of the third transistor $T_{2A}$. Furthermore, the oscillator 90 comprises a third inductor element interconnect 92 that is electrically coupled between a first point $V_{B1}$ on the first inductor element 51A and a second point $V_{A2}$ on the fourth inductor element 51D. The first point $V_{B1}$ on the first inductor element 51A is substantially electrically equivalent to the collector $T_{1B''}$ of the second transistor $T_{1B}$ and the base $T_{1A'}$ of the second transistor $T_{1A}$. The second point $V_{A2}$ on the fourth inductor element 51D is substantially electrically equivalent to the collector $T_{2A''}$ of the third transistor $T_{2A}$ and the base $T_{2B'}$ of the fourth transistor $T_{2B}$.

In the desired oscillation mode, the voltage swing at the first point $V_{A1}$ on the second inductor element 51B and the voltage swing at the second point $V_{B2}$ on the third inductor element 51C will swing in phase with each other. Also, the voltage swing at the first point $V_{B1}$ on the first inductor element 51A and the voltage swing at the second point $V_{A2}$ on the fourth inductor element 51D will swing in phase with each other. Thus, no current will flow through either of the second or third inductor element interconnects 91, 92. Therefore, in the desired oscillation mode, the second or third inductor element interconnects 91, 92 will only act as a small parasitic load.

However, in the undesired in-phase oscillation mode, the voltage swing at the first point $V_{A1}$ on the second inductor element 51B and the voltage swing at the second point $V_{B2}$ on the third inductor element 51C will swing out of phase with each other. Also, the voltage swing at the first point $V_{B1}$ on the first inductor element 51A and the voltage swing at the second point $V_{A2}$ on the fourth inductor element 51D will swing out of phase with each other. Thus, current will flow through both of the second or third inductor element interconnects 91, 92. Therefore, in the undesired in-phase oscillation mode, the second or third inductor element interconnects 91, 92 will act as a heavy load which short-circuits and suppresses the undesired in-phase oscillation.

Thus, these cross-coupled vertical interconnects, that is, the second and third inductor element interconnect 91, 92, are configured to provide electrical connections across the conductive trace loops of the oscillator 80 such that undesired oscillation is further suppressed in the oscillator 90.

Figure 10:
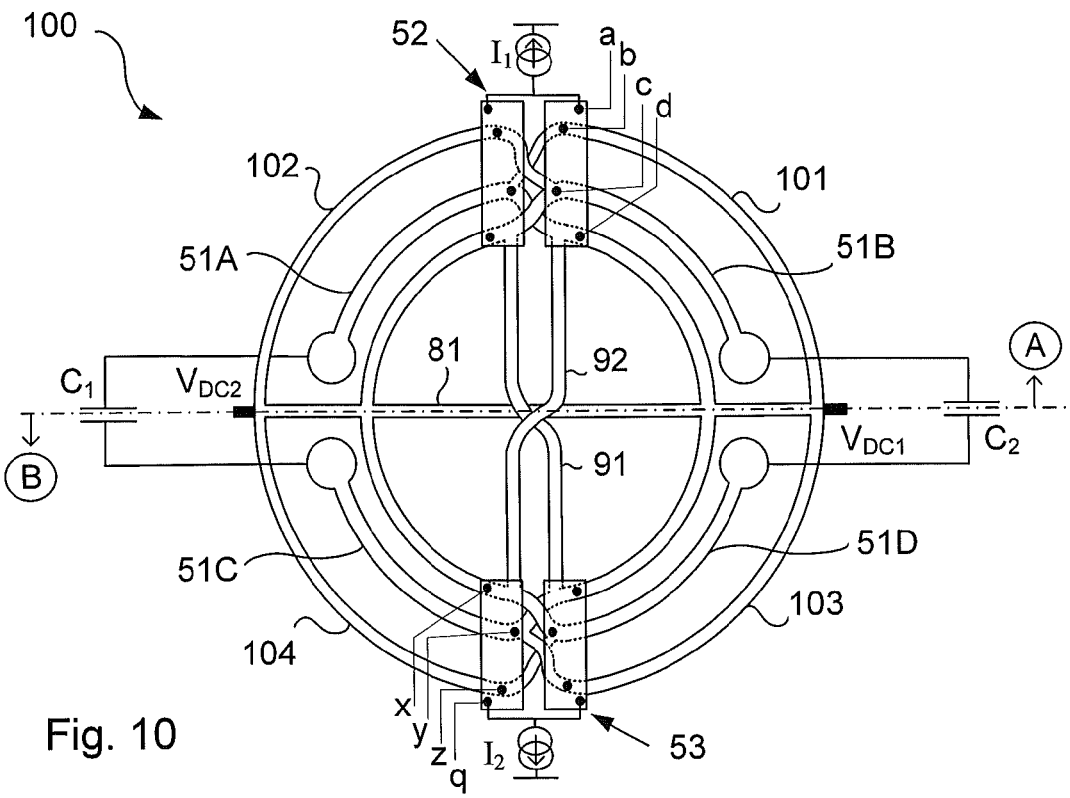
Figure 12:
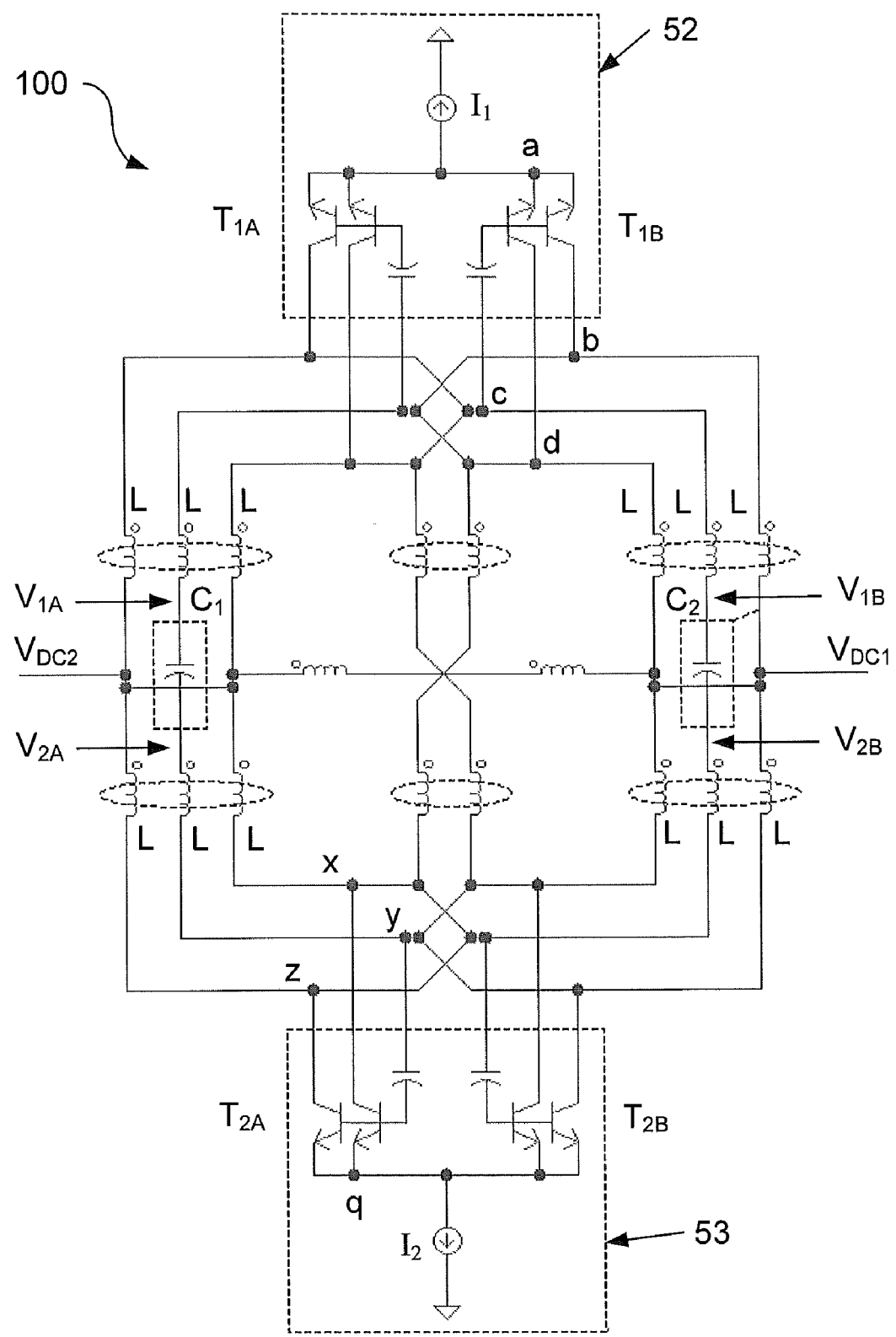

FIG. 10 schematically illustrates an oscillator 100 according to a further embodiment of the invention. The oscillator 100 may be substantially the same as any one of the oscillator 50 described in the embodiment with reference to FIG. 5, the oscillator 80 described in the embodiment with reference to FIG. 8, or the oscillator 90 described in the embodiment with reference to FIG. 9, except in that the oscillator 100 further may comprise a first, second, third and fourth additional inductor element 101, 102, 103, 104. Note that the first, second, third and fourth additional inductor element 101, 102, 103, 104 may be electrically coupled to the first and second drive circuits 52, 53 as illustrated by the electrical connections a, b, c, d, and x, y, z, q, respectively. The electrical connections a, b, c, d, and x, y, z, q, are also illustrated in FIG. 12.

In FIG. 10, the oscillator 100 comprises a first additional inductor element 101 connected to the first inductor element 51A and the first voltage connection point $V_{DC1}$. The first additional inductor element 101 forms a partial outer conductive trace loop, since first additional inductor element 101 is coupled in parallel with a part of the first inductor element 51A. Also, the oscillator 100 comprises a second additional inductor element 102 connected to the second inductor element 51B and the second voltage connection point $V_{DC2}$. The second additional inductor element 102 forms a partial outer conductive trace loop, since the second additional inductor element 102 is coupled in parallel with a part of the second inductor element 51B. Further, the oscillator 100 comprises a third additional inductor element 103 connected to the third inductor element 51C and the first voltage connection point $V_{DC1}$. The third additional inductor element 103 forms a partial outer conductive trace loop, since the third additional inductor element 103 is coupled in parallel with a part of the third inductor element 51C. Furthermore, the oscillator 100 comprises a fourth additional inductor element 104 connected to the fourth inductor element 51D and the second voltage connection point $V_{DC2}$. The fourth additional inductor element 104 forms a partial outer conductive trace loop, since the fourth additional inductor element 104 is coupled in parallel with a part of the fourth inductor element 51D.

By electrically coupling the additional inductor elements 101, 102, 103, 104 to the inductor elements 51A, 51B, 51C, 51D in parallel, the inductance of the combined inductor elements 51A, 51B, 51C, 51D and additional inductor elements 101, 102, 103, 104 will be lower than the inductance of the inductor elements 51A, 51B, 51C, 51D alone. This will allow for a higher current to be used in the oscillator 100 without exceeding the maximum allowed voltage level for the transistors $T_{1A}$, $T_{1B}$, $T_{2A}$, $T_{2B}$ of the first and second drive circuits 52, 53. Consequently, a higher energy storage is enabled which result in lower phase noise in the output signal of the oscillator 100. Thus, the first, second, third and fourth additional inductor element 101, 102, 103, 104 are connected to the first, second, third and fourth inductor elements 51A, 51B, 51C, 51D such that the inductance of the oscillator 100 is reduced.

Additionally, in view of a given maximum allowed voltage swing over the transistors $T_{1A}$, $T_{1B}$, $T_{2A}$, $T_{2B}$ of the first and second drive circuits 52, 53 in the oscillator 100, the use of the additional inductor element 101, 102, 103, 104 to reduce inductance in the oscillator 100 will also lead to a reduced voltage swing over the transistors $T_{1A}$, $T_{1B}$, $T_{2A}$, $T_{2B}$ of the first and second drive circuits 52, 53. This will improve the linearity of the oscillator and result in less conversion of tail current noise into phase noise.

Figure 11:
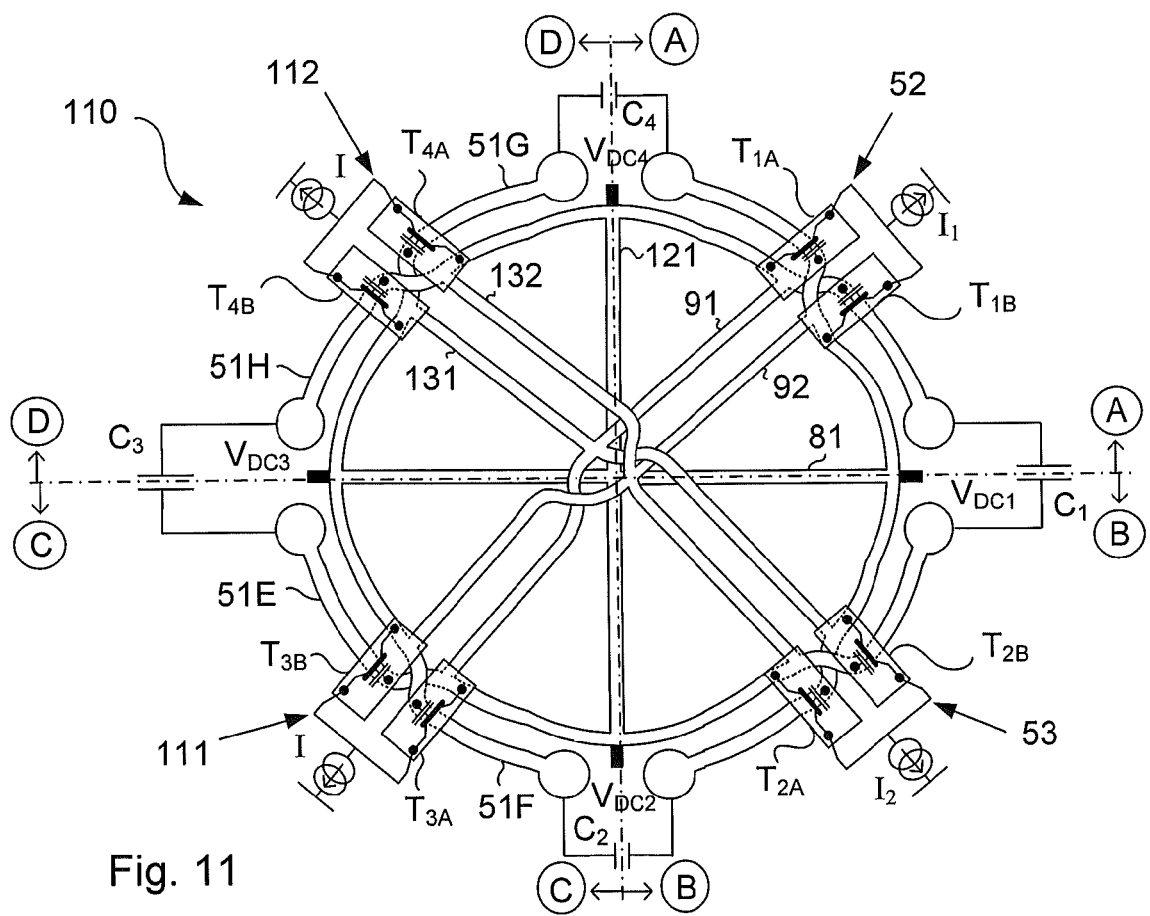

FIG. 11 schematically illustrates an oscillator 110 according to yet a further embodiment of the invention. The oscillator 110 may be substantially the same as any one of the oscillator 50 described in the embodiment with reference to FIG. 5, the oscillator 80 described in the embodiment with reference to FIG. 8, the oscillator 90 described in the embodiment with reference to FIG. 9, or the oscillator 100 described in the embodiment with reference to FIG. 10, except in that the oscillator 110 further may comprise additional resonance circuits C, D, that is, at least a third and a fourth drive circuit 111, 112, at least a third and a fourth capacitive element $C_3$, $C_4$, and at least a fifth, a sixth, a seventh and an eight inductor element 51E, 51F, 51G, 51H.

In previous embodiments, the oscillators 50, 80, 90, 100 have been divided into two resonance circuits A, B. In this embodiment the oscillator 110 is scaled up to also comprise the additional resonance circuits C, D. However, it should be noted that the number of resonance circuits n that may be comprised in the oscillator 110 may be any number of resonance circuit pairs, that is, the number of resonance circuits in the oscillator 110 may be incremented by two, that is, n=2, 4, 6, 8, N wherein N is any integer that may be divided by two. For each resonance circuit pair added to the oscillator, the inductance for each resonance circuit may be lowered and the total capacitance of the oscillator may be increased, which allows more energy to be stored and resulting in even further improved noise performance. This, however, may be balanced against the desired level of noise performance as well as increased energy consumption of the oscillator 110.

In FIG. 11, a coupling of the third drive circuit 111 to the fifth and sixth inductive elements 51E, 51F forms a third resonance circuit C (i.e. the lower left part of the oscillator 110 as indicated by the dashed dotted lines) with the second capacitive element $C_2$ and the third capacitive element $C_3$, and a coupling of the fourth drive circuit 112 to the seventh and eight inductive elements 51G, 51H forms a fourth resonance circuit D (i.e. the upper left part of the oscillator 110 as indicated by the dashed dotted lines) with the third capacitive element $C_3$ and the fourth capacitive element $C_4$. In this way, the first, second, third and fourth drive circuits 52, 53, 111, 112 are mutually configured to establish and maintain a unified oscillation in the first, second, third and fourth resonance circuits A, B, C, D at the desired frequency.

The coupling of the third drive circuit 111 may comprise a fifth transistor $T_{3A}$ and a sixth transistor $T_{3B}$ having their collectors and bases electrically coupled to the fifth and sixth inductor elements 51E, 51F in a corresponding manner as described for the first and second drive circuits 52, 53. Correspondingly, the coupling of the fourth drive circuit 112 may comprise a seventh transistor $T_{4A}$ and a eighth transistor $T_{4B}$ having their collectors and bases electrically coupled to the seventh and eighth inductor elements 51G, 51H in a corresponding manner as described for the first and second drive circuits 52, 53.

In some embodiments and in a corresponding manner as described in a previous embodiment with reference to FIG. 8, the oscillator 110 may comprise a fourth inductor element interconnect 121. The fourth inductor element interconnect 121 and the first inductor element interconnect 81 may be configured to provide an electrical connection across the conductive trace loops formed by the inductor elements 51A, 51B, 51C, 51D, 51E, 51F, 51G, 51H. This may be performed such that undesired oscillation is suppressed in the oscillator 110. As can be seen in FIG. 11, the fourth and first inductor element interconnects 121, 81 may be electrically coupled to each other.

In some embodiments and in a corresponding manner as described in a previous embodiment with reference to FIG. 9, the oscillator 110 may comprise a fifth and a sixth inductor element interconnect 131, 132. The fifth and sixth inductor element interconnects 131, 132 may be configured to in conjunction with the second and third inductor element interconnects 91, 92 provide electrical connections across the conductive trace loops formed by the inductor elements 51A, 51B, 51C, 51D, 51E, 51F, 51G, 51H. This may be performed such that undesired oscillation is further suppressed in the oscillator 110. As can be seen in the embodiment shown in FIG. 11, the second inductor element interconnect 91 is here electrically coupled between the first resonance circuit A and the third resonance circuit C, and the fifth inductor element interconnect 131 is here electrically coupled between the second resonance circuit B and the fourth resonance circuit D. As can be seen in FIG. 11, the second and fifth inductor element interconnects 91, 131 may intersect and be electrically coupled to each other. Furthermore, the third inductor element interconnect 92 is here also electrically coupled between the first resonance circuit A and the third resonance circuit C, and the sixth inductor element interconnect 132 is here electrically coupled between the second resonance circuit B and the fourth resonance circuit D. As can be seen in FIG. 11, the third and sixth inductor element interconnects 92, 132 may intersect and be electrically coupled to each other. This is performed in order to achieve similar oscillation behaviour, as previously described between the resonance circuits A, B in the previous embodiment with reference to FIG. 9, between the first, second, third and fourth resonance circuits A, B, C, D in the oscillator 110.

FIG. 12 schematically illustrates an electrical circuit representation equivalent to the oscillator 100 according to the embodiment of the invention shown in FIG. 10.

The inductor elements 51A, 51B, 51C, 51D, the additional inductor elements 101, 102, 103, 104, the first inductor element interconnect 81, and the second and third inductor element interconnects 91, 92 are here represented by tracks comprising inductors L (the areas indicated by the dashed lines illustrates parallel tracks with mutual inductance). The first drive circuit 52 comprising the first transistor $T_{1A}$, the second transistor $T_{1B}$ and the first tail current DC source $I_1$, and the second drive circuit 53 comprising a third transistor $T_{2A}$, a fourth transistor $T_{2B}$ and a second tail current DC source $I_2$ are shown. The first and second capacitive elements $C_1$ and $C_2$, and the first and second virtual ground points (i.e. the first and second voltage connection points $V_{DC1}$ and $V_{DC2}$) are also shown.

The horizontal and vertical interconnects, that is, the first inductor element interconnect 81 and the second and third inductor element interconnects 91, 92, respectively, may be configured to provide electrical connections across the conductive trace loops of the oscillator 100 such that undesired oscillation is suppressed in the manner as previously described.

It should be noted that the transistors $T_{1A}$, $T_{1B}$, $T_{2A}$, $T_{2B}$, $T_{3A}$, $T_{3B}$, $T_{4A}$, $T_{4B}$ in the oscillators 50, 80, 90, 100, 110 according to the embodiments described above may be any suitable type of transistors, such as, for example, an NPN-transistor, a MOS-transistor, etc. Also, the capacitive elements $C_1$, $C_2$, $C_3$, $C_4$ in the oscillators 50, 80, 90, 100, 110 according to the embodiments described above may comprise any suitable type of capacitors, such as, for example, MIM-capacitors, etc.

Furthermore, all of the oscillators 50, 80, 90, 100, 110 according to the embodiments described above may be formed as an integrated circuit (IC) and integrated on a single die. The oscillators 50, 80, 90, 100, 110 according to the embodiments described above may also be used in a frequency synthesizer comprising a phase-locked loop [PLL] for generating frequencies. The frequency synthesizer may also be arranged to form an integrated, single chip frequency synthesizer with any one of the oscillators 50, 80, 90, 100, 110 according to the embodiments described above by, for example, having the PLL and the oscillator 50, 80, 90, 100, 110 being integrated on the same die.

The oscillators 50, 80, 90, 100, 110 according to the embodiments described above and/or the frequency synthesizer may advantageously be used in a network node for use in a telecommunications network, such as, for example, a mobile radio base station, an access node, a core network node, etc. This is because of the high requirements on noise performance often associated with this type of equipment.

As used herein, the term "comprising" or "comprises" is open-ended, and includes one or more stated features, elements, steps, components or functions but does not preclude the presence or addition of one or more other features, elements, steps, components, functions or groups thereof. As used herein, the term "and/or" includes any and all combinations of one or more of the associated listed items.

As used herein, the common abbreviation "e.g.", which derives from the Latin phrase "exempli gratia," may be used to introduce or specify a general example or examples of a previously mentioned item, and is not intended to be limiting of such item. If used herein, the common abbreviation "i.e.", which derives from the Latin phrase "id est," may be used to specify a particular item from a more general recitation.

The terminology used herein is for the purpose of describing particular embodiments only and is not intended to be limiting of the invention. As used herein, the singular forms "a", "an" and "the" are intended to include the plural forms as well, unless the context clearly indicates otherwise.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element is referred to as being "on", "coupled" or "connected" to another element, it can be directly on, coupled or connected to the other element or intervening elements may also be present. In contrast, when an element is referred to as being "directly on", "directly coupled" or "directly connected" to another element, there are no intervening elements present.

It will be understood that although the terms first, second, third etc. may be used herein to describe various elements, components, regions, layers and/or sections, these elements, components, regions, layers and/or sections should not be limited by these terms. These terms are only used top distinguish one element, component, region, layer or section from another element, component, region, layer or section. Thus, a first element, component, region, layer or section discussed herein could be termed a second element, component, region, layer or section without departing from the teachings of the present invention.

Spatially relative terms, such as "horizontal", "vertical", "outer", "inner", "beneath", "below", "bottom", "lower", "above", "top", "upper" and the like, may be used herein for ease of description to describe one element's or feature's relationship to other element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

Example embodiments have been described herein with reference to cross-section illustrations that are schematic illustrations of idealized embodiments (and intermediate structures). As such, variations from the shapes of the illustrations as a result, for example, of manufacturing techniques and/or tolerances are to be expected. Thus, the embodiments should not be construed as limited to the particular shapes of regions illustrated herein but are to include deviations in shape that result, for example, from manufacturing.

It should also be noted that in addition to the exemplary embodiments shown in the accompanying drawings, the invention may be embodied in different forms and therefore should not be construed as limited to the embodiments set forth herein. Rather, these embodiments are provided so that this disclosure will be thorough and complete, and will fully convey the concept of the invention to those skilled in the art.

The invention claimed is:

1. An oscillator for use in generating a signal having a desired frequency in a frequency synthesizer, comprising:
   a first inductor element being electrically coupled from one end of a first capacitive element to a first voltage connection point;
   a second inductor element being electrically coupled from one end of a second capacitive element to a second voltage connection point;
   a third inductor element being electrically coupled from another end of the first capacitive element to the first voltage connection point;

a fourth inductor element being electrically coupled from another end of the second capacitive element to the second voltage connection point;

said first, second, third, and fourth inductor elements being configured such that a first conductive trace loop formed by the first and third inductor elements is interleaved with a second conductive trace loop formed by the second and fourth inductor elements such that said conductive trace loops are configured to operate in substantially a same magnetic field, wherein a first drive circuit is electrically coupled to the first and second inductor elements between the first and second capacitive elements such that the first and second inductor elements connect the first drive circuit to the first and second capacitive elements, respectively, so as to form a first resonance circuit with the first and second capacitive elements and a second drive circuit is electrically coupled to the third and fourth inductor elements between the first and second capacitive elements such that the third and fourth inductor elements connect the second drive circuit to the first and second capacitive elements, respectively, so as to form a second resonance circuit with the first and second capacitive elements, such that the first and second drive circuits are mutually configured to establish and maintain a unified oscillation in the first and second resonance circuits at the desired frequency.

2. An oscillator according to claim 1, wherein
the first drive circuit comprise a first transistor having first base and first collector terminals, the first transistor being configured such that the first collector terminal is electrically coupled to the second inductor element and the first base terminal is electrically coupled to the first inductor element, and a second transistor having second base and second collector terminals, the second transistor being configured such that the second collector terminal is electrically coupled to the first inductor element and the second base terminal is electrically coupled to the second inductor element; and
the second drive circuit comprises a third transistor having third base and third collector terminals, the third transistor being configured such that the third collector terminal is electrically coupled to the fourth inductor element and the third base terminal is electrically coupled to the third inductor element, and a fourth transistor having fourth base and fourth collector terminals, the fourth transistor being configured such that the fourth collector terminal is electrically coupled to the third inductor element and the fourth base terminal is electrically coupled to the fourth inductor element.

3. An oscillator according to claim 1, further comprising:
a first inductor element interconnect configured to provide an electrical connection across the first and second conductive trace loops formed by the first, second, third, and fourth inductor elements such that undesired oscillation is suppressed in the oscillator.

4. An oscillator according to claim 3, wherein the first inductor element interconnect is configured to provide an electrical connection between the first voltage connection point on the first conductive trace loop formed by the first and third inductor elements and the second voltage connection point on the second conductive trace loop formed by the second and fourth inductor elements.

5. An oscillator according to claim 4, further comprising:
a second and a third inductor element interconnect configured to provide electrical connections across the first and second conductive trace loops formed by the inductor elements such that undesired oscillation is suppressed in the oscillator.

6. An oscillator according to claim 5, wherein the second inductor element interconnect is configured to provide an electrical connection between a first point on the second inductor element being substantially electrically equivalent to the first collector terminal of the first transistor, and a second point on the third inductor element being substantially electrically equivalent to the fourth collector terminal of the fourth transistor; and
the third inductor element interconnect is configured to provide an electrical connection between a first point on the first inductor element being substantially electrically equivalent to the second collector terminal of the second transistor, and a second point on the fourth inductor element being substantially electrically equivalent to the third collector terminal of the third transistor.

7. An oscillator according to claim 6, further comprising:
at least fifth, sixth, seventh, and eighth inductor elements connected to the first, second, third and fourth inductor elements such that the inductance of the oscillator is reduced.

8. An oscillator according to claim 7, wherein the fifth inductor element is connected to the first inductor element and the first voltage connection point to form a first partial outer conductive trace loop, said first partial outer conductive trace loop being coupled in parallel with a part of the first inductor element; the sixth inductor element is connected to the second inductor element and the second voltage connection point to form a second partial outer conductive trace loop, said second partial outer conductive trace loop being coupled in parallel with a part of the second inductor element; the seventh inductor element is connected to the third inductor element and the first voltage connection point to form a third partial outer conductive trace loop, said third partial outer conductive trace loop being coupled in parallel with a part of the third inductor element; and the eighth inductor element is connected to the fourth inductor element and the second voltage connection point to form a fourth partial outer conductive trace loop, said fourth partial outer conductive trace loop being coupled in parallel with a part of the fourth inductor element.

9. An oscillator according to claim 8, further comprising:
at least a third drive circuit and a fourth drive circuit, at least a third capacitive element and a fourth capacitive element, and at least fifth, sixth, seventh and eight inductor elements being configured to form at least a third resonance circuit and a fourth resonance circuit and being configured to be electrically coupled to the first and second drive circuits, the first and second capacitive elements, and the first, second, third and fourth inductor elements, such that the first and second drive circuits and the at least third and fourth drive circuits are mutually configured to establish and maintain a unified oscillation in the first and second, and at least third and fourth resonance circuits at the desired frequency.

10. An oscillator according to claim 9, further comprising:
a fourth inductor element interconnect, wherein the fourth inductor element interconnect and the first inductor element interconnect are configured to provide an electrical connection across the conductive trace loops formed by the inductor elements such that undesired oscillation is suppressed in the oscillator.

11. An oscillator according to claim 10, further comprising:
a fifth inductor element interconnect and sixth inductor element interconnect, wherein the fifth and sixth inductor element interconnects and the second and third inductor element interconnects are configured to provide electrical connections across the conductive trace loops formed by the inductor elements such that undesired oscillation is suppressed in the oscillator.

12. An oscillator according to claim 2, wherein the transistors are NPN-transistors or MOS-transistors, and the capacitive elements comprise at least one capacitor which is digitally programmable and/or tunable, said at least one capacitor being MIM-capacitors.

13. An oscillator according to claim 1, wherein the oscillator is formed as an integrated circuit [IC] and is integrated on a single die.

14. A frequency synthesizer comprising:
a phase-locked loop [PLL] for generating frequencies, and
an oscillator coupled to the PLL, comprising:
a first inductor element being electrically coupled from one end of a first capacitive element to a first voltage connection point;
a second inductor element being electrically coupled from one end of a second capacitive element to a second voltage connection point;
a third inductor element being electrically coupled from another end of the first capacitive element to the first voltage connection point;
a fourth inductor element being electrically coupled from another end of the second capacitive element to the second voltage connection point;
said first, second, third, and fourth inductor elements being configured such that a first conductive trace loop formed by the first and third inductor elements is interleaved with a second conductive trace loop formed by the second and fourth inductor elements such that said conductive trace loops are configured to operate in substantially a same magnetic field,
wherein a first drive circuit is electrically coupled to the first and second inductor elements between the first and second capacitive elements such that the first and second inductor elements connect the first drive circuit to the first and second capacitive elements, respectively, so as to form a first resonance circuit with the first and second capacitive elements and a second drive circuit is electrically coupled to the third and fourth inductor elements between the first and second capacitive elements such that the third and fourth inductor elements connect the second drive circuit to the first and second capacitive elements, respectively, so as to form a second resonance circuit with the first and second capacitive elements, such that the first and second drive circuits are mutually configured to establish and maintain a unified oscillation in the first and second resonance circuits at the desired frequency.

15. A frequency synthesizer according to claim 14, wherein the PLL and the oscillator are integrated on the same die so as to form an integrated, single chip frequency synthesizer.

16. Apparatus for use in a telecommunications network comprising:
an oscillator, comprising:
a first inductor element being electrically coupled from one end of a first capacitive element to a first voltage connection point;
a second inductor element being electrically coupled from one end of a second capacitive element to a second voltage connection point;
a third inductor element being electrically coupled from another end of the first capacitive element to the first voltage connection point;
a fourth inductor element being electrically coupled from another end of the second capacitive element to the second voltage connection point;
said first, second, third, and fourth inductor elements being configured such that a first conductive trace loop formed by the first and third inductor elements is interleaved with a second conductive trace loop formed by the second and fourth inductor elements such that said conductive trace loops are configured to operate in substantially a same magnetic field,
wherein a first drive circuit is electrically coupled to the first and second inductor elements between the first and second capacitive elements such that the first and second inductor elements connect the first drive circuit to the first and second capacitive elements, respectively, so as to form a first resonance circuit with the first and second capacitive elements and a second drive circuit is electrically coupled to the third and fourth inductor elements between the first and second capacitive elements such that the third and fourth inductor elements connect the second drive circuit to the first and second capacitive elements, respectively, so as to form a second resonance circuit with the first and second capacitive elements, such that the first and second drive circuits are mutually configured to establish and maintain a unified oscillation in the first and second resonance circuits at the desired frequency.

17. An apparatus according to claim 16, wherein the apparatus is a mobile radio base station.

18. An apparatus according to claim 16, further comprising:
a phase-locked loop [PLL] for generating frequencies coupled to the oscillator.

* * * * *

UNITED STATES PATENT AND TRADEMARK OFFICE
CERTIFICATE OF CORRECTION

| | | |
|---|---|---|
| PATENT NO. | : 8,339,210 B2 | Page 1 of 1 |
| APPLICATION NO. | : 13/130670 | |
| DATED | : December 25, 2012 | |
| INVENTOR(S) | : Nylén | |

It is certified that error appears in the above-identified patent and that said Letters Patent is hereby corrected as shown below:

On the Title Page, Item (12), under "United States Patent", in Column 1, Line 1, delete "Nylen" and insert -- Nylén --, therefor.

On the Title Page, Item (75), under "Inventor", in Column 1, Line 1, delete "Tomas Nylen, Upplands Vasby" and insert -- Tomas Nylén, Upplands Väsby --, therefor.

In the Specification

In Column 15, Line 48, delete "6, 8, N" and insert -- 6, 8, ..., N, --, therefor.

Signed and Sealed this
Sixth Day of August, 2013

Teresa Stanek Rea
*Acting Director of the United States Patent and Trademark Office*